United States Patent
Ko et al.

(10) Patent No.: US 11,008,181 B2
(45) Date of Patent: May 18, 2021

(54) SYSTEM FOR TRANSFERRING SUBSTRATE

(71) Applicant: Samsung Display Co., Ltd., Yongin-Si (KR)

(72) Inventors: Youngsoo Ko, Asan-si (KR); Seungkyu Park, Asan-si (KR)

(73) Assignee: Samsung Display Co., Ltd.

( * ) Notice: Subject to any disclaimer, the term of this patent is extended or adjusted under 35 U.S.C. 154(b) by 126 days.

(21) Appl. No.: 16/256,960

(22) Filed: Jan. 24, 2019

(65) Prior Publication Data

US 2019/0375603 A1 Dec. 12, 2019

(30) Foreign Application Priority Data

Jun. 7, 2018 (KR) .................. 10-2018-0065190

(51) Int. Cl.
| | |
|---|---|
| *B65G 47/91* | (2006.01) |
| *G01L 1/18* | (2006.01) |
| *H05K 13/04* | (2006.01) |
| *G01L 5/00* | (2006.01) |
| *H05K 13/08* | (2006.01) |
| *B25J 15/06* | (2006.01) |

(52) U.S. Cl.
CPC ........ *B65G 47/917* (2013.01); *B25J 15/0616* (2013.01); *G01L 1/18* (2013.01); *G01L 5/009* (2013.01); *H05K 13/0409* (2018.08); *H05K 13/082* (2018.08); *H05K 13/089* (2018.08); *H05K 13/0882* (2018.08)

(58) Field of Classification Search
CPC ......... B65G 47/917; G01L 1/18; G01L 5/009; H05K 13/0409; H05K 13/089; H05K 13/082; H05K 13/0882; B25J 15/0616
See application file for complete search history.

(56) References Cited

U.S. PATENT DOCUMENTS

| | | | | |
|---|---|---|---|---|
| 5,420,488 A | * | 5/1995 | Gutman | B65H 3/0883 318/568.12 |
| 9,488,538 B2 | | 11/2016 | Thillainadarajah et al. | |
| 9,669,550 B2 | * | 6/2017 | Accou | B25J 15/0625 |
| 2001/0045755 A1 | * | 11/2001 | Schick | B25J 15/0061 294/65 |
| 2002/0121789 A1 | * | 9/2002 | Duebel | H05K 13/0413 294/185 |
| 2013/0127192 A1 | * | 5/2013 | Regan | B32B 38/1858 294/185 |
| 2015/0239680 A1 | * | 8/2015 | Ogle | B65G 47/91 264/148 |
| 2017/0120452 A1 | | 5/2017 | Truyens | |

FOREIGN PATENT DOCUMENTS

| | | | |
|---|---|---|---|
| KR | 10-1606334 B1 | | 3/2016 |
| KR | 10-2016-046846 A | | 12/2016 |
| KR | 20160149433 A | * | 12/2016 |

* cited by examiner

*Primary Examiner* — Stephen A Vu

(74) *Attorney, Agent, or Firm* — Innovation Counsel LLP

(57) ABSTRACT

A system for transferring a substrate may adjust a suction force to a suitable level. The system may include a work table, a picker, and a pressure measuring unit. The work table may include a work area for supporting the substrate. The picker may be disposed above the work table and may include a suction unit for providing the suction force. The pressure measuring unit may overlap the suction unit and may include a pressure-sensitive element for facilitating adjustment of the suction force.

20 Claims, 12 Drawing Sheets

SYSTEM FOR TRANSFERRING SUBSTRATE

CROSS-REFERENCE TO RELATED APPLICATION

This application claims priority under 35 U.S.C. § 119 to Korean Patent Application No. 10-2018-0065190, filed on Jun. 7, 2018, in the Korean Intellectual Property Office (KIPO); the disclosure of the Korean Patent Application is incorporated by reference herein in its entirety.

BACKGROUND

1. Technical Field

The technical field relates to a system (or device) for transferring one or more substrates.

2. Discussion of Related Art

A substrate transferring system may include a picker that adheres to a substrate for transferring the substrate to a specific piece of process equipment. The picker includes a suction unit.

If the suction force of the suction unit is too weak, the substrate may not firmly adhere to the suction unit. If the suction force of the suction unit is too strong, the substrate may be damaged.

This Background section is intended to provide useful background for understanding technology related to this application. This Background section may include information that is not known to those skilled in the pertinent art prior to the effective filing date of this application.

SUMMARY

Embodiments may be directed to a system for transferring substrates. The system may manage a suction force of a picker according to a suitable level.

According to an embodiment, a system for transferring substrates includes: a work table including a work area at which a substrate is placed; a picker disposed above the work table and including a suction unit; and a pressure measuring unit separated from the suction unit and including a pressure-sensitive element.

The pressure-sensitive element may be disposed corresponding to the suction unit.

The suction unit may include a suction surface having a suction hole.

The pressure-sensitive element may include: a surface pressure-sensitive element overlapping the suction surface; and a hole pressure-sensitive element overlapping the suction hole.

The surface pressure-sensitive element may overlap an edge portion of the suction surface.

The surface pressure-sensitive element may overlap a central portion of the suction surface.

The pressure measuring unit may be disposed on the work table.

The pressure measuring unit may be disposed at the work area of the work table.

The work table may further include a non-work area disposed adjacent to the work area.

The pressure measuring unit may be disposed at the non-work area of the work table.

The pressure measuring unit may further include: a base layer on which the pressure-sensitive element is disposed; and a protective layer disposed on the base layer with the pressure-sensitive element interposed between the protective layer and the base layer.

The pressure-sensitive element may be a piezoelectric element or a load cell.

According to an embodiment, a system for transferring substrates includes: a system for transferring substrates includes: a work table including a work area at which a substrate is placed; and a picker disposed above the work table and including a suction unit. The suction unit includes: a nozzle portion disposed at an end of the suction unit; and a pressure measuring unit disposed at the nozzle portion and including pressure-sensitive elements.

The pressure-sensitive element may be disposed at a suction surface of the nozzle portion.

The suction surface may have a plurality of suction holes, and the pressure-sensitive element may be disposed at the suction surface except the suction holes.

The pressure measuring unit may include: a base layer on which the pressure-sensitive element is disposed; and a protective layer disposed on the base layer with the pressure-sensitive element interposed between the protective layer and the base layer.

The pressure-sensitive element and the protective layer may be disposed between the base layer and the nozzle portion.

At least one of the protective layer and the pressure-sensitive element may include amorphous silicon.

The pressure-sensitive element may be a piezoelectric element or a load cell.

The protective layer may not be disposed between adjacent ones of the pressure-sensitive elements.

An embodiment may be related to a system for transferring a substrate. The system may include the following elements: a work table comprising a work area for supporting the substrate; a picker comprising a suction unit; and a pressure measuring unit comprising a pressure sensor and positioned between the picker and a portion of the work table in a direction perpendicular to the work area.

The suction unit may overlap the pressure sensor.

The suction unit may include a first-type suction hole and a suction surface surrounding the first-type suction hole.

The pressure measuring unit may include the following elements: a surface pressure sensor overlapping the suction surface; and a first hole pressure sensor overlapping the first-type suction hole.

The surface pressure sensor may be positioned closer to a perimeter of the suction surface than to the first-type suction hole.

The suction unit further may include a second-type suction hole. The surface pressure sensor may be positioned between the first-type suction hole and the second-type suction hole.

The pressure measuring unit may directly contact the work table.

The pressure measuring unit may be disposed at the work area of the work table.

The work table further may include a non-work area disposed adjacent to the work area.

The pressure measuring unit may be disposed at the non-work area of the work table.

The pressure measuring unit further may include the following elements: a base layer on which the pressure sensor may be disposed; and a protective layer disposed on the base layer with the pressure sensor interposed between the protective layer and the base layer.

The pressure sensor may be a piezoelectric element or a load cell.

An embodiment may be related to a system for transferring a substrate. The system may include the following elements: a work table comprising a work area for supporting the substrate; and a picker disposed above the work table and comprising a suction unit. The suction unit may include the following elements: a nozzle portion disposed at an end of the suction unit; and a pressure measuring unit disposed at the nozzle portion and including pressure sensors.

The nozzle portion may include a suction surface. The pressure sensors may be disposed at the suction surface.

The nozzle portion further may include a plurality of suction holes. Each of the suction holes may be surrounded by the suction surface in a bottom view of the system. The pressure sensors may be disposed at the suction surface and may be spaced from the suction holes in the bottom view of the system.

The pressure measuring unit may include the following elements: a base layer on which the pressure sensors may be disposed; and a protective layer disposed on the base layer with the pressure sensor interposed between the protective layer and the base layer.

The pressure sensors and the protective layer may be disposed between the base layer and the nozzle portion.

At least one of the protective layer and the pressure sensors may include amorphous silicon.

At least one of the pressure sensors may be a piezoelectric element or a load cell.

The protective layer may not fill a space between adjacent ones of the pressure sensors. No solid material may be filled between the adjacent ones of the pressure sensors.

DETAILED DESCRIPTION

Figure 1:
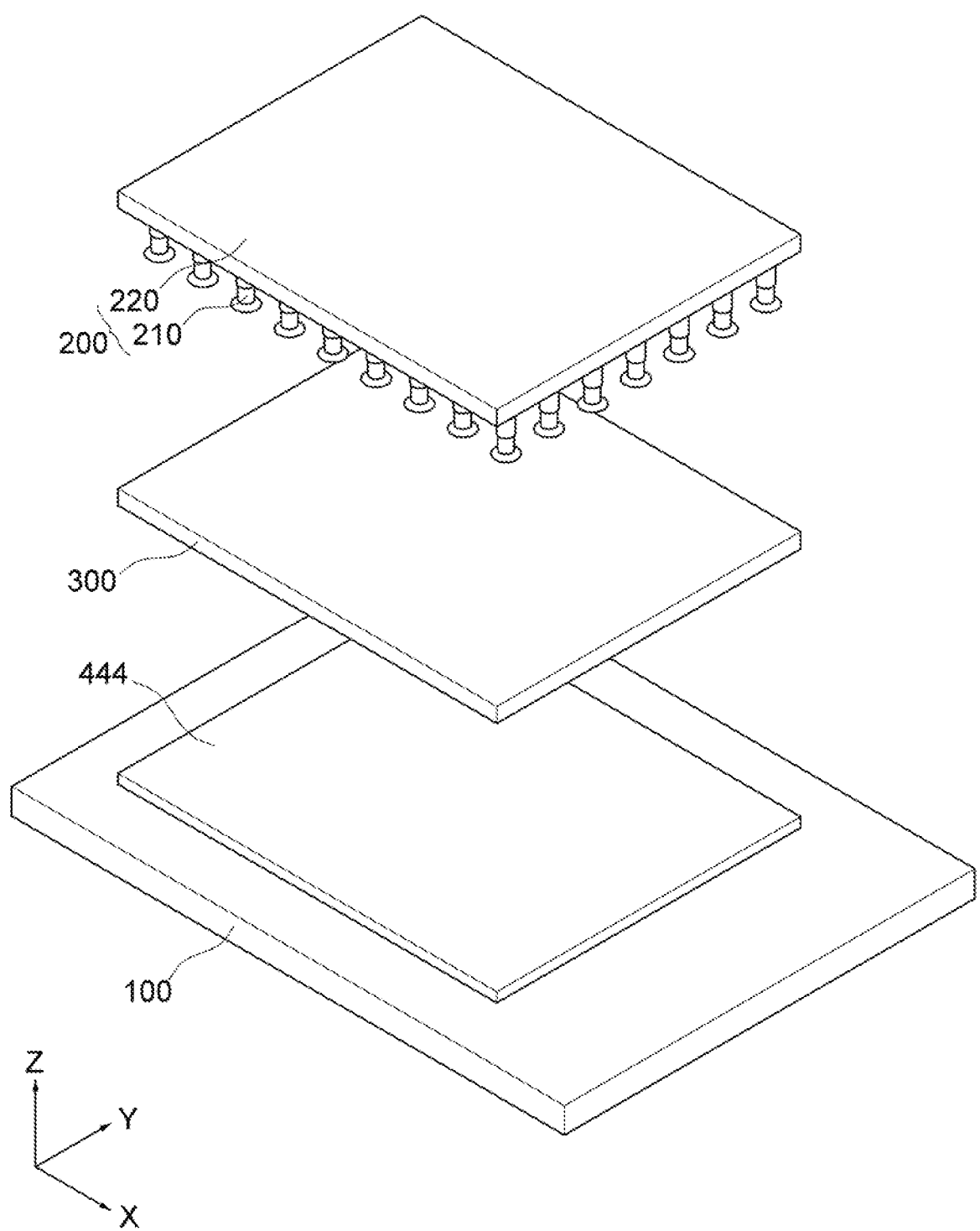
FIG. 1 is a perspective view illustrating a system for transferring substrates according to an embodiment.

Embodiments are described with reference to the accompanying drawings. The described embodiments may be modified in various manners.

In the drawings, thicknesses of layers and areas may be illustrated in an enlarged manner for clarity and/or ease of description.

Although the terms "first," "second," etc. may be used herein to describe various elements, these elements, should not be limited by these terms. These terms may be used to distinguish one element from another element. Thus, a first element may be termed a second element without departing from teachings of one or more embodiments. The description of an element as a "first" element may not require or imply the presence of a second element or other elements. The terms "first," "second," etc. may also be used herein to differentiate different categories or sets of elements. For conciseness, the terms "first," "second," etc. may represent "first-type (or first-set)," "second-type (or second-set)," etc., respectively.

When a first element is referred to as being "on" or "connected to" a second element, the first element may be directly on or directly connected to the second element, or one or more intervening elements may be present between the first element and the second element. When a first element is referred to as being "directly on" a second element, no intended intervening element (except environmental elements such as air) may be present between the first element and the second element.

The spatially relative terms "below," "beneath," "lower," "above," "upper" or the like, may be used herein for ease of description to describe the relations between one element and another element as illustrated in the drawings. The spatially relative terms may encompass different orientations of the device in use or operation, in addition to the orientation depicted in the drawings. For example, in the case where a device illustrated in the drawing is turned over, a first element positioned "below" or "beneath" a second element may be placed "above" the second element. Accordingly, the illustrative term "below" may include lower and upper positions. The device may also be oriented in the other direction and thus the spatially relative terms may be interpreted differently depending on the orientations.

The terms "comprises," "including," "includes" and/or "including" may specify the presence of stated elements or steps, but do not preclude the presence or addition of one or more other elements or steps.

"About" or "approximately" may be inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, terms used in this application (including technical and scientific terms) have the same meanings as commonly understood by those skilled in the art. Terms should be interpreted as having meanings that are consistent with the context of the relevant art and should not be interpreted in an ideal or excessively formal sense unless clearly defined in the present specification.

Like reference numerals may refer to like elements. The term "system" may mean "device"; the term "pressure-sensitive element" may mean "pressure sensor"; the term "portion" may mean "member"; the term "contact" may mean "direct contact" or "directly contact."

Figure 2:
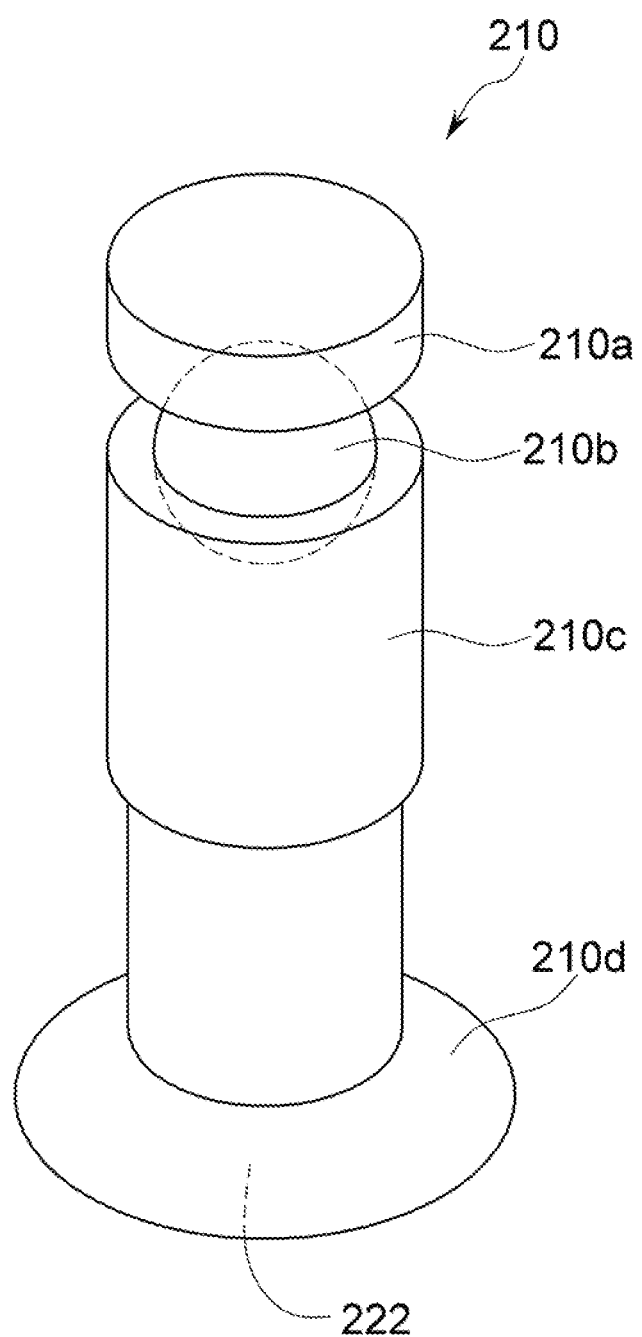
FIG. 2 is a perspective view illustrating a suction unit according to an embodiment.

FIG. 1 is a perspective view illustrating a system for transferring substrates according to an embodiment, and FIG. 2 is a view illustrating a suction unit of the system according to an embodiment.

The system for transferring substrates includes a work table 100, a picker 200, and a pressure measuring-controlling unit 300 (or "pressure measuring unit 300" for conciseness), as illustrated in FIG. 1.

The work table 100 provides a work area at which a substrate 444 (e.g., a substrate for a display device) is to be placed. The substrate 444 may be placed on the work area of the work table 100. The substrate 444 may contact a surface of the work area of the work table 100. The work area of the work table 100 may be located at an upper surface of the work table 100. For example, the upper surface of the work table 100 located between the picker 200 and a lower surface of the work table 100 in a Z-axis direction, and the work area of the work table 100 is located at the upper surface.

The picker 200 is disposed above the work table 100. The picker 200 may lift the substrate 444. The picker 200 includes a body portion 220 (i.e., a picker substrate) and at least one suction unit 210.

Although not illustrated, the body portion 220 may include a vacuum pump.

The suction unit 210 is attached to a lower surface of the body portion 220 and positioned between the body portion 220 and the work table 100 in the Z-axis direction.

The suction unit 210 may protrude from the lower surface of the body portion 220 (toward the work table 100).

The suction unit 210 may include a fixing portion 210a, a joint member 210b, an extension portion 210c, and a nozzle portion 210d, as illustrated in FIG. 2.

The fixing portion 210a is fixed to the body portion 220. The suction unit 210 may be fixed to the body portion 220 by the fixing portion 210a.

The extension portion 210c is connected to the fixing portion 210a through the joint member 210b. The extension portion 210c is rotatably coupled to the joint member 210b. The extension portion 210c may rotate and/or change orientations around the joint member 210b.

The nozzle portion 210d is coupled to the extension portion 210c. The nozzle portion 210d is located at an end of the suction unit 210. The nozzle portion 210d may contact the substrate 444. The nozzle portion 210d may have a maximum width (e.g., a diameter) greater than a maximum width (e.g., a diameter) of other portions of the suction unit 210 in an X-axis direction or a Y-axis direction. The suction unit 210 may include at least one suction hole 260 (see FIG. 5). The suction hole 260 may be positioned at a suction surface 222 of the nozzle portion 210d. The suction surface 222 is a surface of the nozzle portion 210d that makes contact with the substrate 444. The suction hole 260 may be connected to the aforementioned vacuum pump. The vacuum pump sucks air toward inside of the suction unit 210 through the suction hole 260. The substrate 444 may adhere to the suction surface 222 of the suction unit 210 by a suction force of the suction unit 210.

The pressure measuring unit 300 measures the suction force and an adhesion force of the suction unit 210. The suction force of the suction unit 210 means a pressure of the air sucked through the suction hole 260 of the suction unit 210. The suction force of the suction unit 210 may mean a pressure between the suction hole 260 and the substrate 444. The adhesion force of the suction unit 210 may mean a pressure between the substrate 444 and the suction surface 222 of the suction unit 210.

The pressure measuring unit 300 may be disposed between the work table 100 and the picker 200. The pressure measuring unit 300 may be placed between the work table 100 and the suction unit 210 of the picker 200. For measuring the suction force and the adhesion force of the suction unit 210, the pressure measuring unit 300 is disposed between the work table 100 and the picker 200. After the measurement of the suction force and the adhesion force has been completed, the pressure measuring unit 300 is transferred away for exposing the picker 200 to the substrate 444 on the work table 100.

Figure 3:
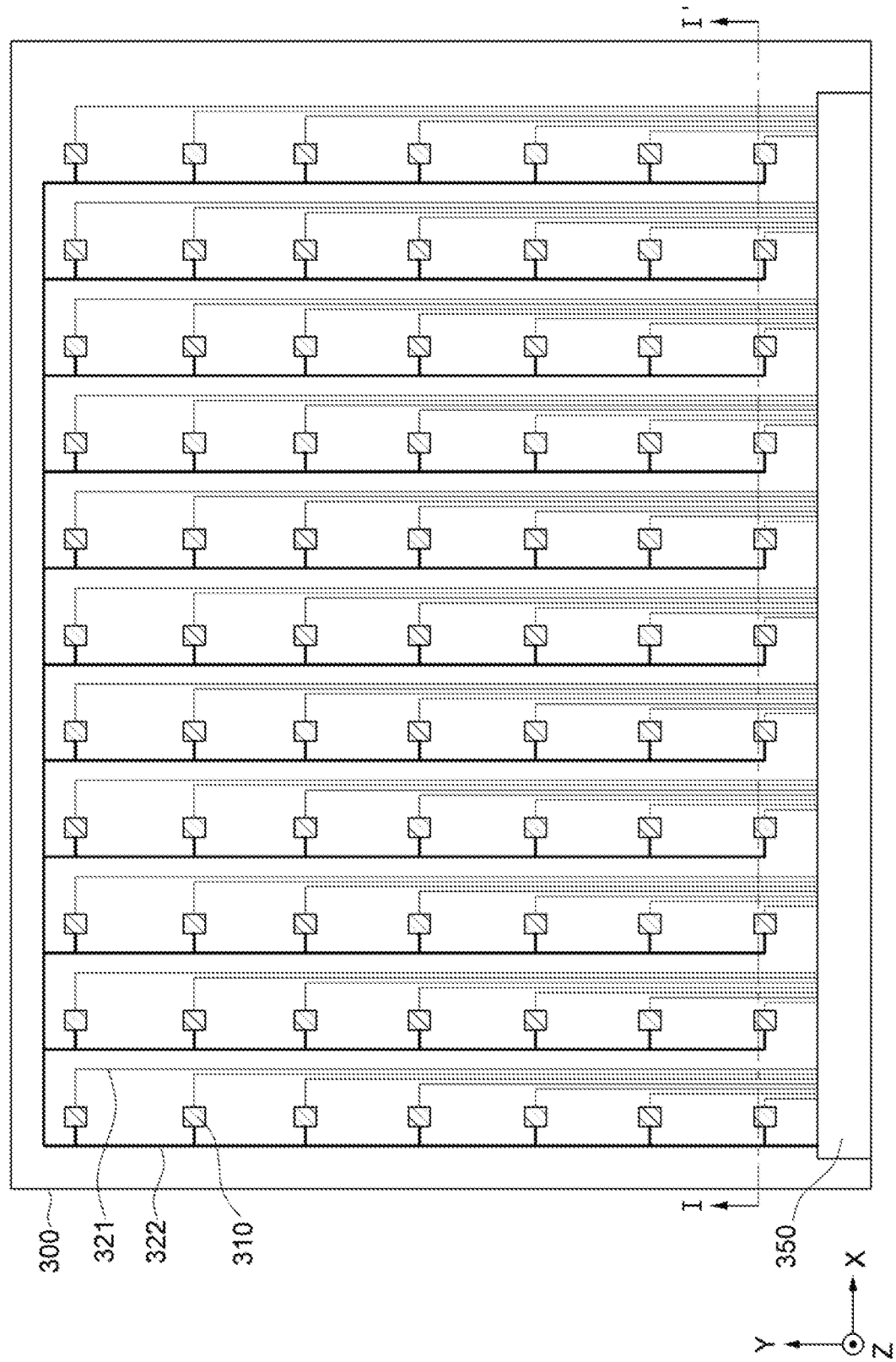
FIG. 3 is a plan view illustrating a pressure measuring unit according to an embodiment.
Figure 4:
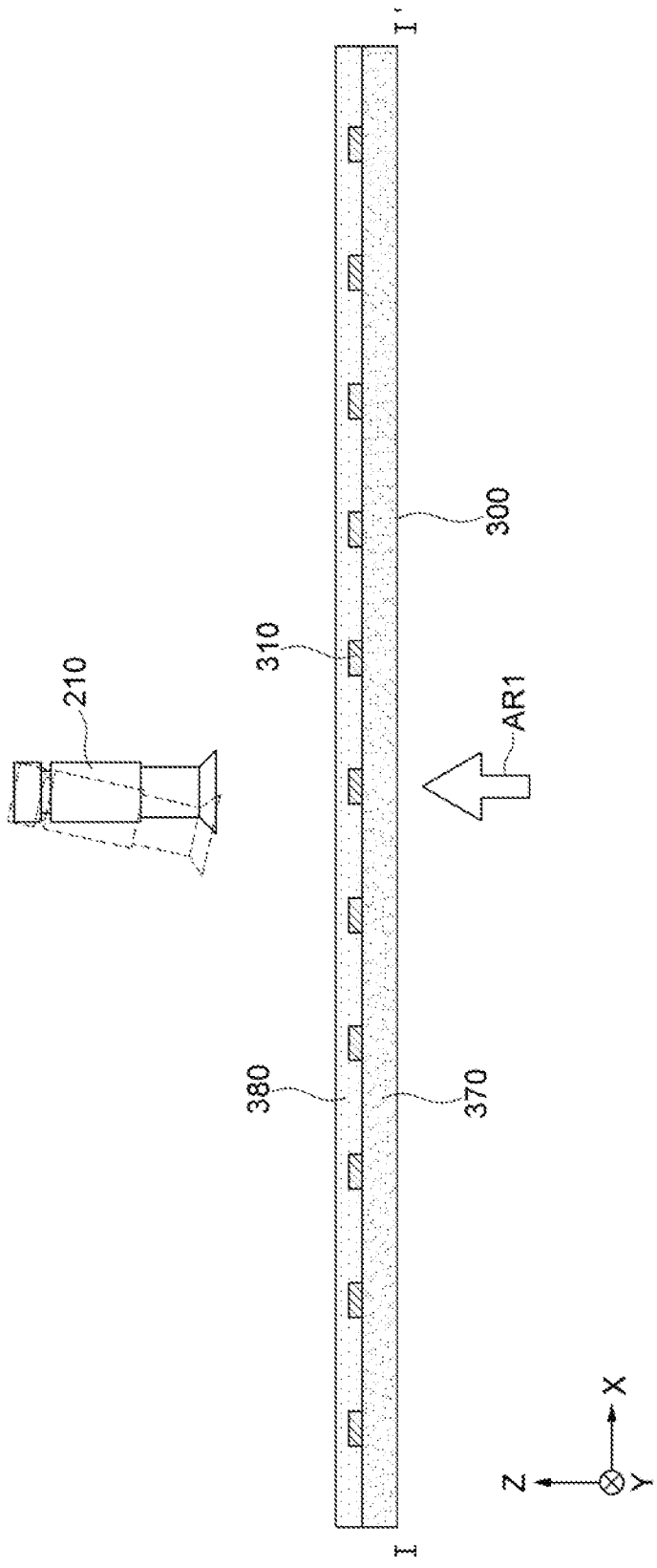
FIG. 4 illustrates a suction unit and a cross-sectional view taken along line I-I' in FIG. 3 according to an embodiment.
Figure 5:
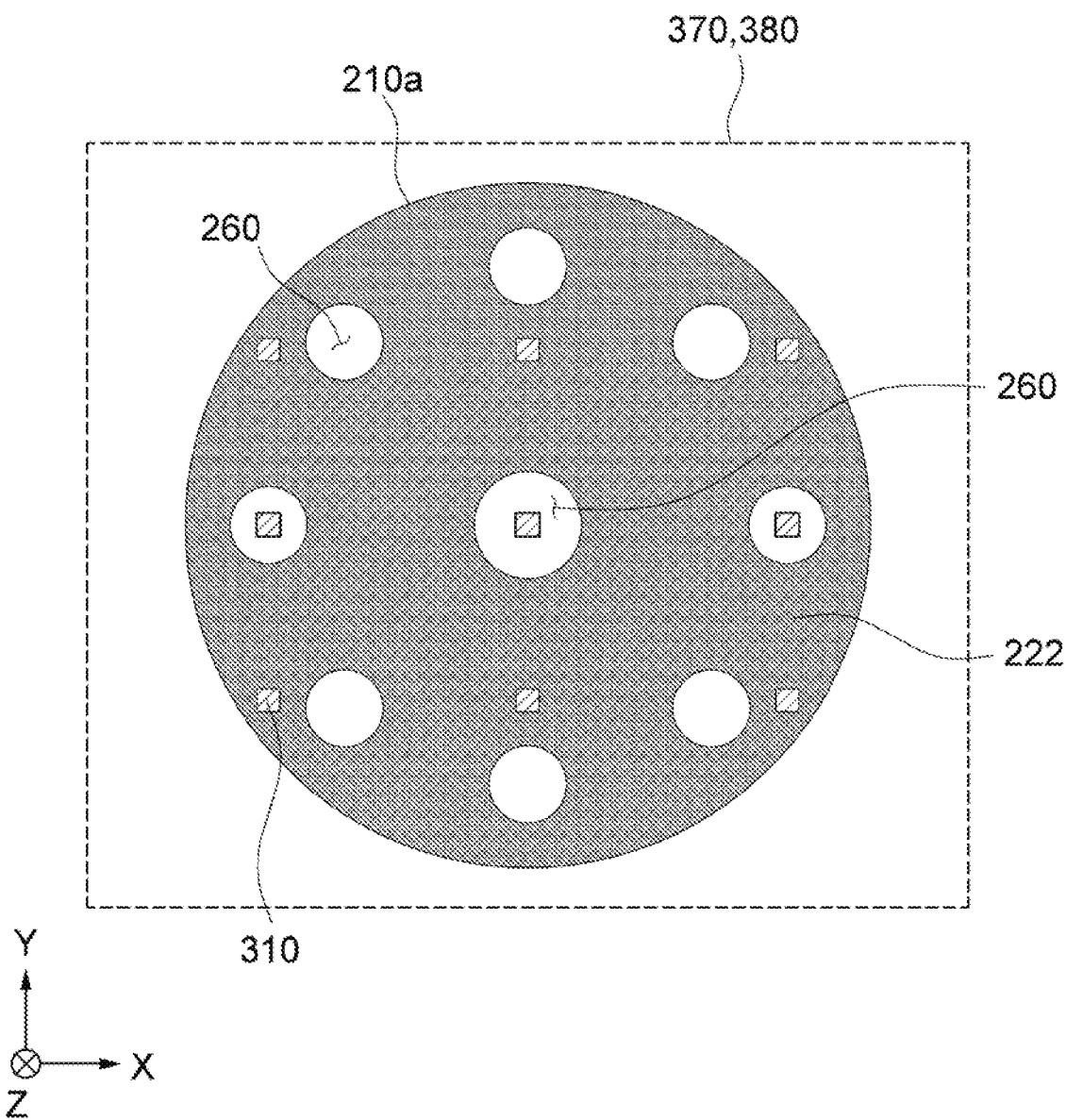
FIG. 5 is a view illustrating a portion of the pressure measuring unit and a suction unit viewed in a direction indicated by an arrow in FIG. 4 according to an embodiment.

FIG. 3 is a plan view illustrating the pressure measuring unit 300 of FIG. 1 according to an embodiment, FIG. 4 illustrates a suction unit 210 and a cross-sectional view taken along line I-I' in FIG. 3 according to an embodiment, and FIG. 5 is a view illustrating a portion of the pressure measuring unit 300 and the suction unit 210 viewed in a direction indicated by an arrow AR1 in FIG. 4 according to an embodiment.

The pressure measuring unit 300 may include a base layer 370, a pressure-sensitive element 310 (or pressure sensor 310), a first signal line 321, a second signal line 322, a protective layer 380, and a controller 350, as illustrated in FIGS. 3 and 4.

The base layer 370 may include at least one of, for example, polyethylene terephthalate (PET), polycarbonate (PC), acryl, polymethyl methacrylate (PMMA), triacetyl cellulose (TAC), polyether sulfone (PES), and polyimide (PI). The base layer 370 may be a thin film including at least one of the materials mentioned above.

The pressure-sensitive element 310, the first signal line 321, and the second signal line 322 are disposed on the base layer 370.

The pressure measuring unit 300 may include a plurality of pressure-sensitive elements 310. The pressure-sensitive elements 310 may be arranged in a matrix (e.g., a two-dimensional array).

At least one pressure-sensitive element 310 may include/be, for example, a piezoresistive material or a piezoelectric sensor. In an embodiment, a pressure-sensitive element 310 may be a load cell.

The signal lines 321 and 322 extend from the controller 350 and are (electrically) connected to each of the pressure-sensitive elements 310. In an embodiment, pressure-sensitive elements 310 are electrically connected to first signal lines 321, respectively, and a plurality of pressure-sensitive elements 310 are electrically connected to one common second signal line 322.

In an embodiment, a second signal line 322 of FIG. 3 is thicker and/or wider than a first signal line 321. In an embodiment, a first signal lines 321 may as thick as and/or as wide as a second signal line 322.

A pressure-sensitive element 310 may sense a pressure (or a pressure change), and may outputs a sensing signal as a result of the sensing. The sensing signal from the pressure-sensitive element 310 is applied to the controller 350 through the first signal line 321 connected to the pressure-sensitive element 310. A plurality of sensing signals from a plurality of pressure-sensitive elements 310 are applied to the controller 350 through a plurality of first signal lines 321.

The controller 350 may receive a plurality of sensing signals through a plurality of first signal lines 321. The controller 350 may calculate the suction force(s) or the adhesion force(s) of the corresponding suction units 210 based on the sensing signals. For example, as illustrated in FIG. 5, one suction unit 210 may overlap a plurality of pressure-sensitive elements 310. In an embodiment, several pressure-sensitive elements 310 respectively overlap (positions of) several suction holes 260 of the suction unit 210, and several pressure-sensitive elements 310 overlap the suction surface 222 of the suction unit 210. A pressure-sensitive element 310 that overlaps the suction hole may be referred to as "a hole pressure-sensitive element" and may sense a pressure generated by the suction force of the suction unit 210, which may be a pressure between the suction hole 260 of the suction unit 210 and the pressure measuring unit 300. A pressure-sensitive element 310 that overlaps the suction surface 222 may be referred to as "a surface pressure-sensitive element" and may sense a pressure between the suction surface 222 and the pressure measuring unit 300.

The controller 350 may calculate a suction force of the suction unit 210 based on a level of a sensing signal ("suction sensing signal") from a hole pressure-sensitive element 310. The suction force may be proportional to the level of the suction sensing signal. When a plurality of suction sensing signals are provided from a plurality of hole pressure-sensitive elements 310, the controller 350 may calculate an average value of the plurality of suction sensing signals as the suction force of the suction unit 210.

The controller 350 may determine whether the suction force of the suction unit 210 is desirable based on the average value of the suction sensing signals. For example, when the average value of the suction sensing signals is within a predetermined range, the controller 350 may determine that the suction force of the suction unit 210 is desirable. On the other hand, when the average value of the suction sensing signals is beyond the predetermined range, the controller 350 may determine that the suction force of the suction unit 210 is undesirable.

The controller 350 may calculate an adhesion force of the suction unit 210 based on a level of a sensing signal ("adhesion sensing signal") from a surface pressure-sensitive element 310. In an embodiment, due to, for example, tilting of the suction unit 210, the suction surface 222 may not accurately contact the pressure measuring unit 300. For example, when the extension portion 210c and the nozzle portion 210d of the suction unit 210 rotate or change orientations around the joint member 210b, the suction unit 210 may be tilted, as illustrated by dotted lines in FIG. 4. In an embodiment, the adhesion force between the pressure measuring unit 300 and a part of the suction surface 222 may be reduced. For example, when a suction unit 210 (shown by the dotted line) is tilted as illustrated in FIG. 4, an adhesion force between the pressure measuring unit 300 and a left portion of the suction surface 222 overlapping a first surface pressure-sensitive element 310 may be significantly less than an adhesion force between the pressure measuring unit 300 and a right portion of the suction surface 222 overlapping a second surface pressure-sensitive element 310. As a result, a first adhesion sensing signal provided from the first surface pressure-sensitive element 310 may be significantly less than a second adhesion sensing signal provided from the second surface pressure-sensitive element 310.

The controller 350 may compare a value of each of the adhesion sensing signals with a predetermined reference value and may determine whether or not the suction unit 210 is tilted based on the comparison result. For example, the aforementioned first adhesion sensing signal may have a value less than the reference value, the second adhesion sensing signal may have a value substantially equal to or greater than the reference value, and the controller 350 may determine that the suction unit 210 is tilted.

After the controller 350 has determined that the suction force and the adhesion force of the suction units 210 are desirable (or acceptable), the picker 200 may lift the substrate 444 using the suction unit 210.

In an embodiment, in order to improve the adhesion between the suction unit 210 and the substrate 444, the suction unit 210 may be tilted in a specific direction according to the structures of the surface of the substrate 444.

Figure 6:
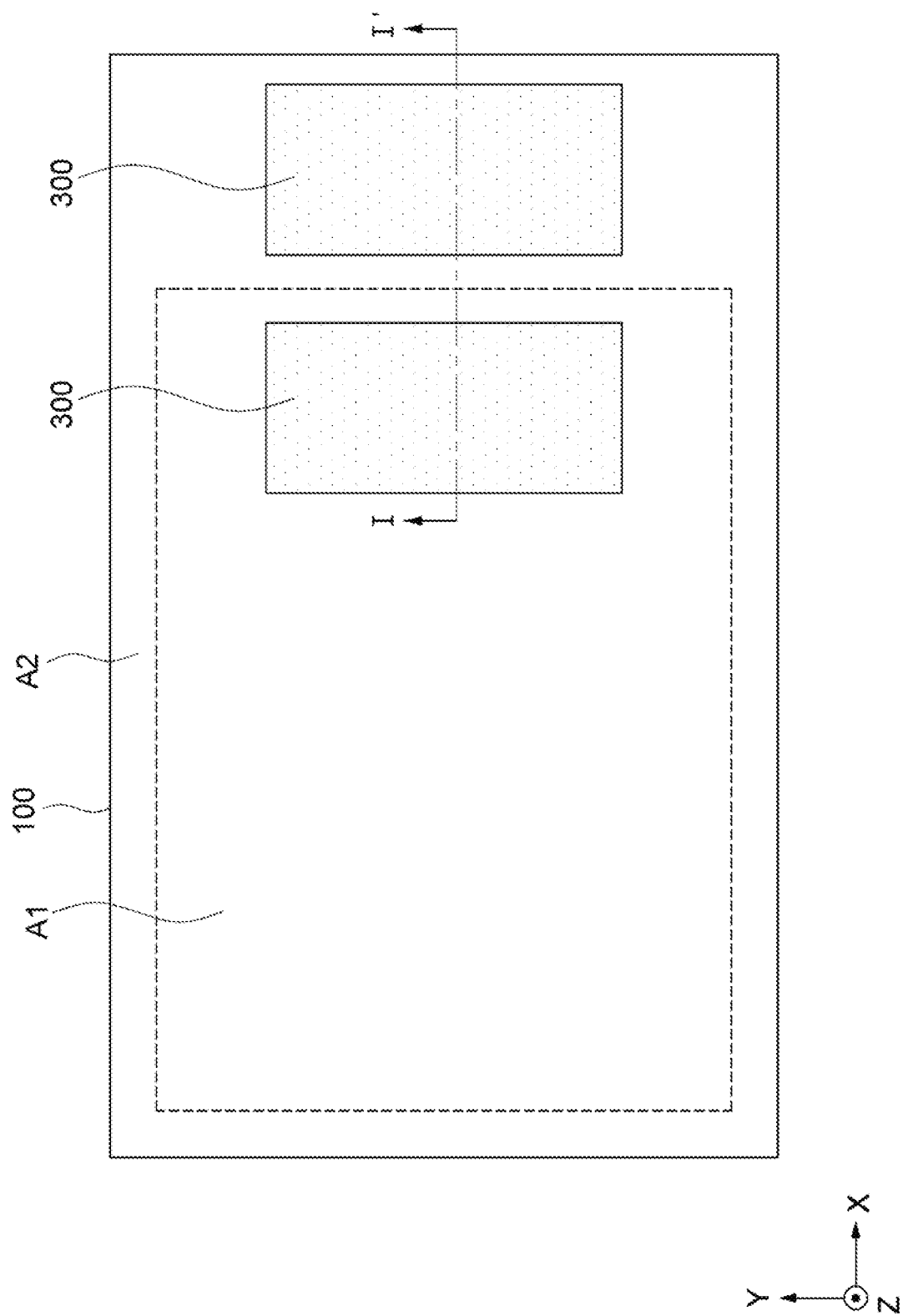
FIG. 6 is a plan view illustrating a work table and at least one pressure measuring unit according to an embodiment.
Figure 7:
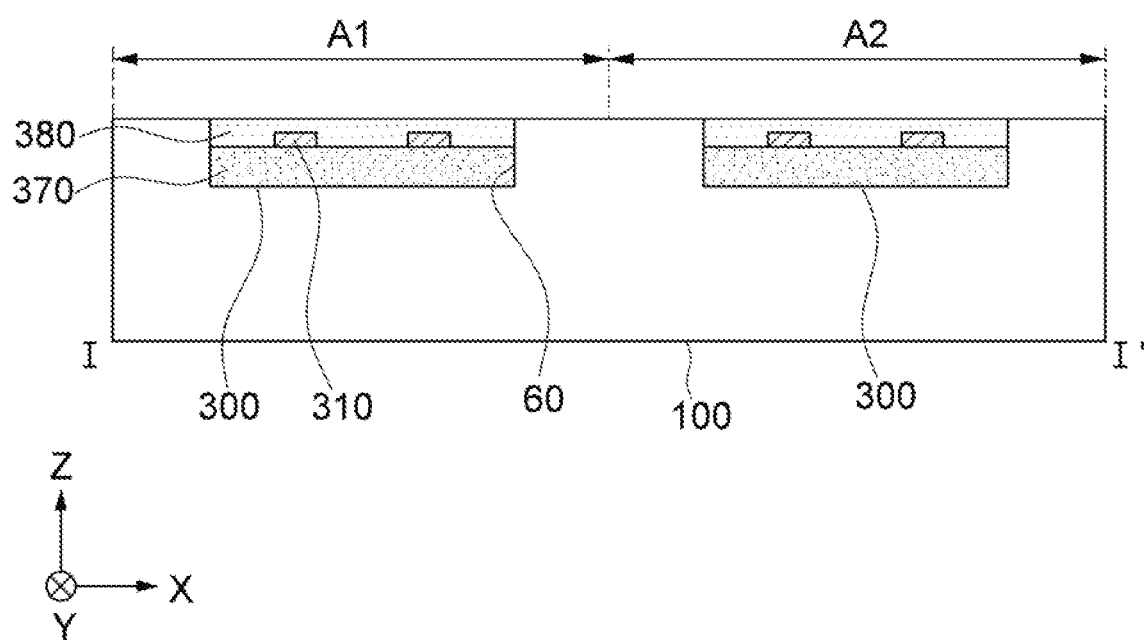
FIG. 7 is a cross-sectional view taken along line I-I' of FIG. 6 according to an embodiment.

FIG. 6 is a plan view illustrating the work table 100 and one or more pressure measuring units 300 according to an embodiment, and FIG. 7 is a cross-sectional view taken along line I-I' of FIG. 6 according to an embodiment.

As illustrated in FIGS. 6 and 7, the work table 100 may include a work area A1 and a non-work area A2. An upper surface of the work table 100 may include the work area A1 and the non-work area A2. The work area A1 may support one or more substrates, e.g., the substrate 444 illustrated in FIG. 1. The non-work area A2 is located at an edge portion of the upper surface of the work table 100. The non-work area A2 is located adjacent to the work area A1. The non-work area A2 may surround the work area A1.

The pressure measuring unit 300 may be located in the work table 100. Portions of the work table 100 may surround the pressure measuring unit 300.

The pressure measuring unit 300 may be disposed at the work area A1 or the non-work area A2 of the work table 100. In an embodiment, the pressure measuring unit 300 may be located at/near an edge of the work area A1. A plurality of pressure measuring units 300 may be disposed at the work area A1 and/or the non-work area A2. As an example, a first pressure measuring units 300 may be disposed at the work area A1, and a second pressure measuring units 300 may be disposed at the non-work area A2.

The first pressure measuring unit 300 may be attached to the work area A1 of the work table 100, and the second pressure measuring unit 300 may be attached to the non-work area A2 of the work table 100. For example, as illustrated in FIG. 7, each pressure measuring unit 300 may be inserted into a cavity 60 of the work table 100. In an embodiment, a pressure measuring unit 300 may contact an inner wall of a cavity 60. After the first pressure measuring unit 300 and/or the second pressure measuring unit 300 have provided sensing signals to the controller 350, and after the controller 350 has determined that the suction force and the adhesion force of the suction units 210 are desirable, the picker 200 may move to lift a substrate 444.

A substrate transferring system may include a work table 100 illustrated in FIG. 1 and one or more suction units 210 illustrated in one of more of FIG. 8, FIG. 9, FIG. 10, FIG. 11, and FIG. 12.

Figure 8:
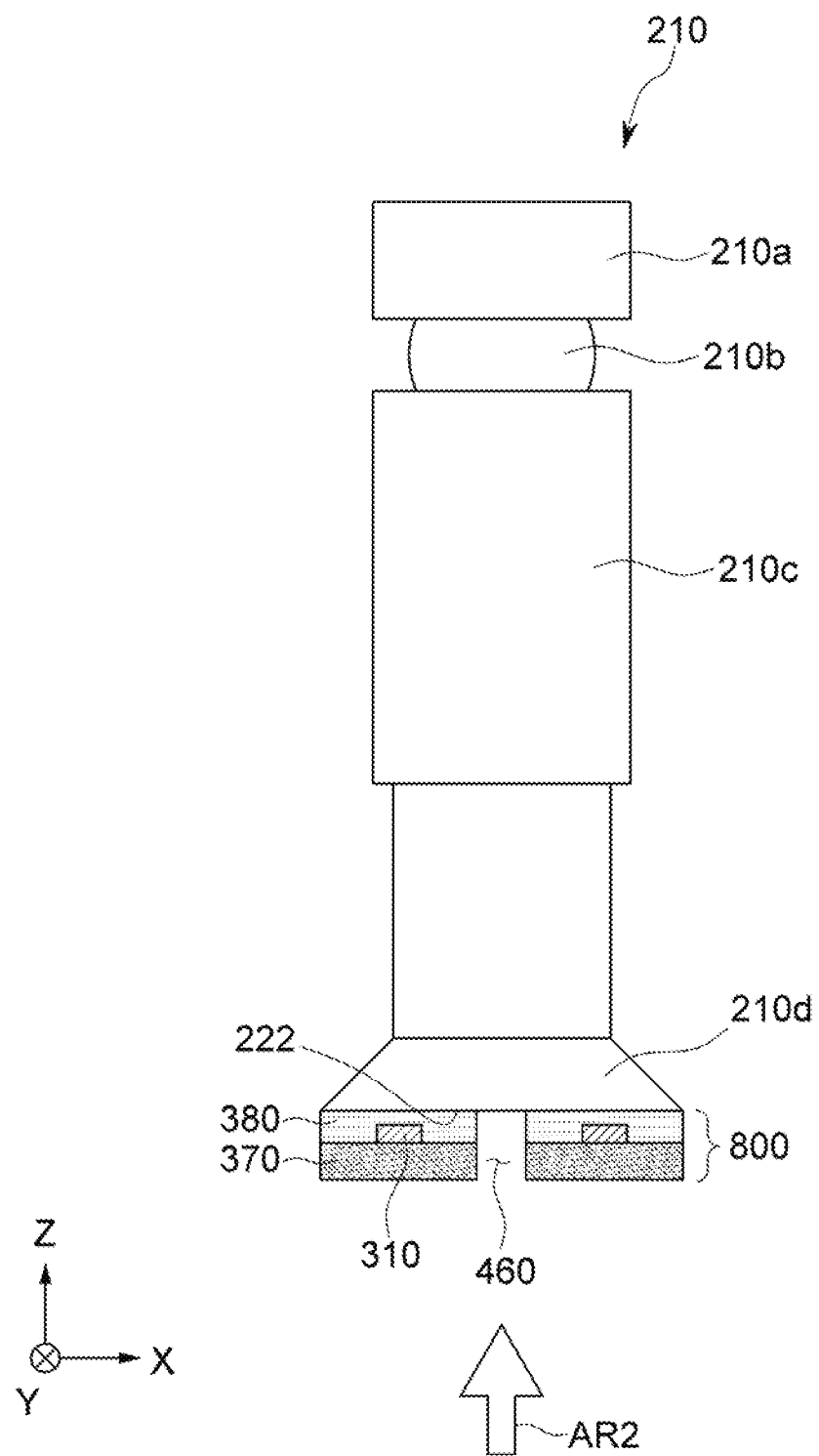
FIG. 8 is a side view illustrating a suction unit according to an embodiment according to an embodiment.
Figure 9:
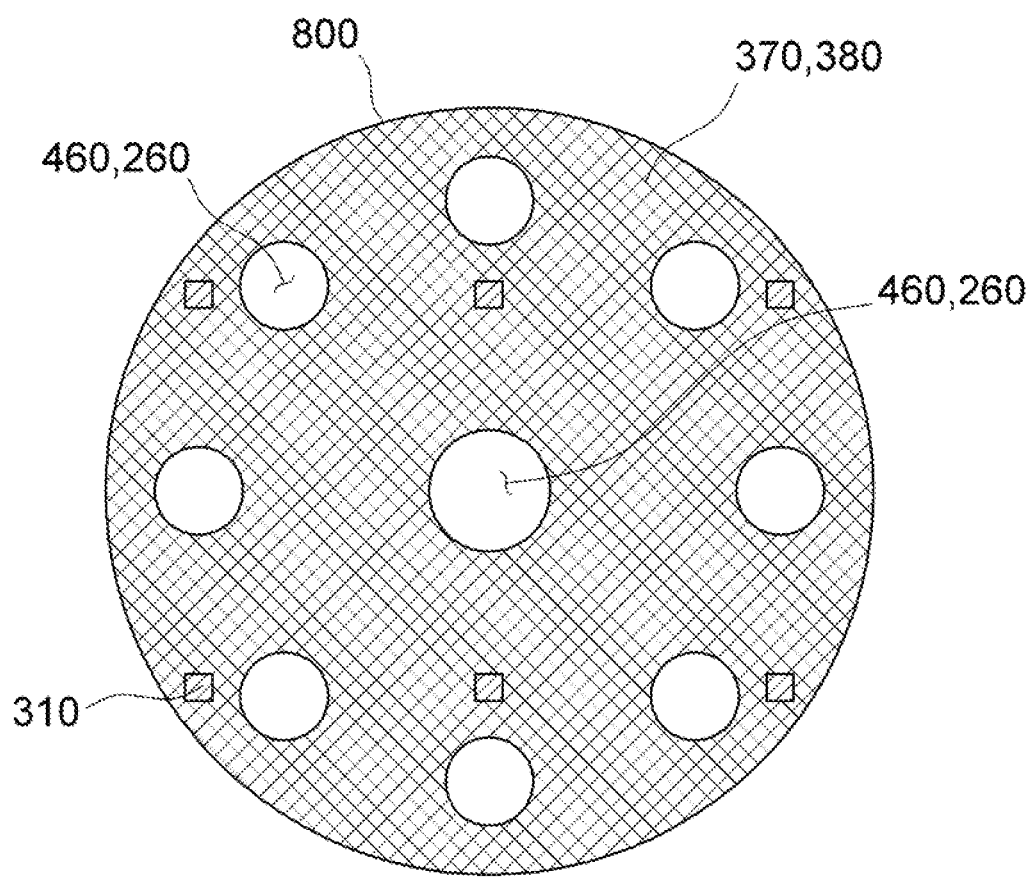
FIG. 9 is a bottom view illustrating the suction unit viewed in a direction indicated by an arrow in FIG. 8 according to an embodiment.

FIG. 8 is a side view illustrating a suction unit 210 according to an embodiment, and FIG. 9 is a view illustrating the suction unit 210 viewed in a direction indicated by an arrow AR2 in FIG. 8 according to an embodiment.

As illustrated in FIGS. 8 and 9, the suction unit 210 may include a pressure measuring unit 800. The pressure measuring unit 800 may be disposed at a nozzle portion 210d of the suction unit 210. Specifically, the pressure measuring unit 800 may be disposed on a suction surface 222 of the nozzle portion 210d. In an embodiment, the pressure measuring unit 800 may be attached to the suction surface 222. The pressure measuring unit 800 of FIG. 8 may have elements and/or structures substantially the same as or analogous to elements and/or structures of the pressure measuring unit 300 illustrated in FIG. 3. As illustrated in FIG. 8, the pressure measuring unit 800 further has a hole 460 corresponding to a suction hole 260. In an embodiment, pressure-sensitive elements 310 of FIG. 8 are all surface pressure-sensitive elements 310 overlapping the suction surface 222.

As illustrated in FIG. 9, the pressure measuring unit 800 may have a circular shape, corresponding to the shape of the suction surface.

A picker 200 including the suction unit 210 of FIG. 8 may contact a work table 100. Specifically, the pressure measuring unit 800 of the suction unit 210 may contact the work table 100. In an embodiment, the suction surface 222 adheres to the work table 100 by a suction force of the suction unit 210. As a result, a pressure is applied to the pressure-sensitive elements 310 between the suction surface 222 and the work table 100, and a sensing signal (i.e., an adhesion sensing signal) corresponding to the pressure may be applied to a controller 350. The controller 350 may be disposed at the suction unit 210 or a body portion 220. After the forces of the picker 200 have been calibrated using the work table 100, the picker 200 may be used to lift a substrate 444.

A pressure measuring unit 800 of FIG. 8 may be attached to each corresponding suction unit 210.

In an embodiment, the pressure measuring unit 800 illustrated in FIG. 8 is attached to the suction surface 222 of the suction unit 210 through a protective layer 380 of the pressure measuring unit 800. The protective layer 380 of the pressure measuring unit 800 may include an adhesive. For example, the protective layer 380 may include amorphous silicon (a-Si). In an embodiment, a first signal line 321, a second signal line 322, and a pressure-sensitive element 310 of the pressure measuring unit 800 may include polysilicon. In an embodiment, the protective layer 380 may include the amorphous silicon.

A method of manufacturing the protective layer 380, the first signal line 321, the second signal line 322, and the pressure-sensitive element 310 may include the following steps.

First, an amorphous silicon layer is formed on the base layer 370.

Next, portions of the amorphous silicon layer that correspond to the first signal line 321, the second signal line 322, and the pressure-sensitive element 310 are irradiated with an excimer laser beam in a selective manner. The portions of the amorphous silicon layer irradiated with the excimer laser beam are polycrystallized and serve as the first signal line 321, the second signal line 322, and the pressure-sensitive element 310. A portion of the amorphous silicon layer that is not irradiated with the excimer laser beam is a non-polycrystallized portion and serves as the protective layer 380.

Figure 10:
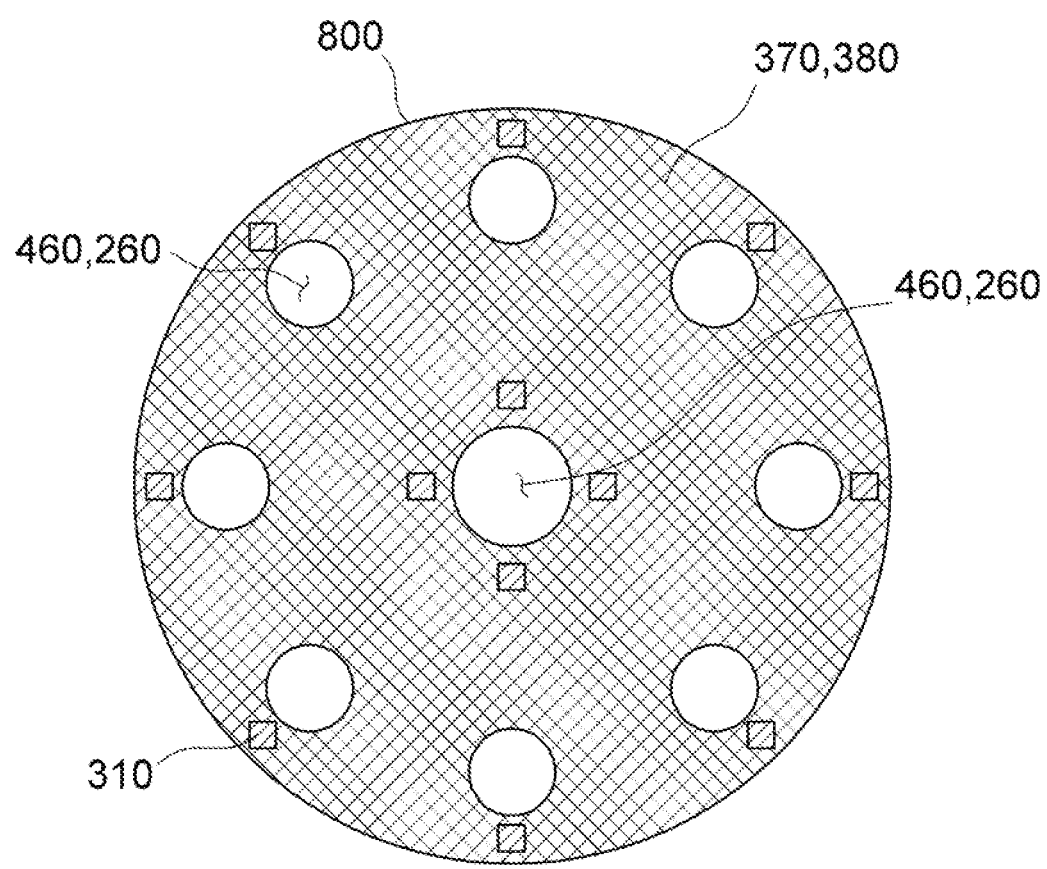
FIG. 10 is a bottom view illustrating a suction unit viewed in the direction indicated by the arrow in FIG. 8 according to an embodiment.

FIG. 10 is a view illustrating a suction unit 210 viewed in the direction indicated by the arrow AR2 in FIG. 8 according to an embodiment.

As illustrated in FIG. 8 and FIG. 10, the suction unit 210 may include a pressure measuring unit 800. The pressure measuring unit 800 may be disposed at a nozzle portion 210d of the suction unit 210. Specifically, the pressure measuring unit 800 may be disposed on a suction surface 222 of the nozzle portion 210d. In an embodiment, the pressure measuring unit 800 may be attached to the suction surface 222 of the nozzle portion 210d.

The pressure measuring unit 800 of FIG. 10 may have elements and/or structures substantially the same as or analogous to elements and/or structures of the pressure measuring unit 300 of FIG. 3. As illustrated in FIG. 10, the pressure measuring unit 800 further has a hole 460 corresponding to a suction hole 260. In an embodiment, pressure-sensitive elements 310 of FIG. 10 are all surface pressure-sensitive elements 310.

As illustrated in FIG. 10, the pressure-sensitive elements 310 may be disposed at a center portion and an edge portion of the pressure measuring unit 800. A first set of pressure-sensitive elements 310 may surround the center hole 460. A second set of sensitive elements 310 may be positioned between edge holes 460 and the perimeter of the pressure measuring unit 800.

Figure 11:
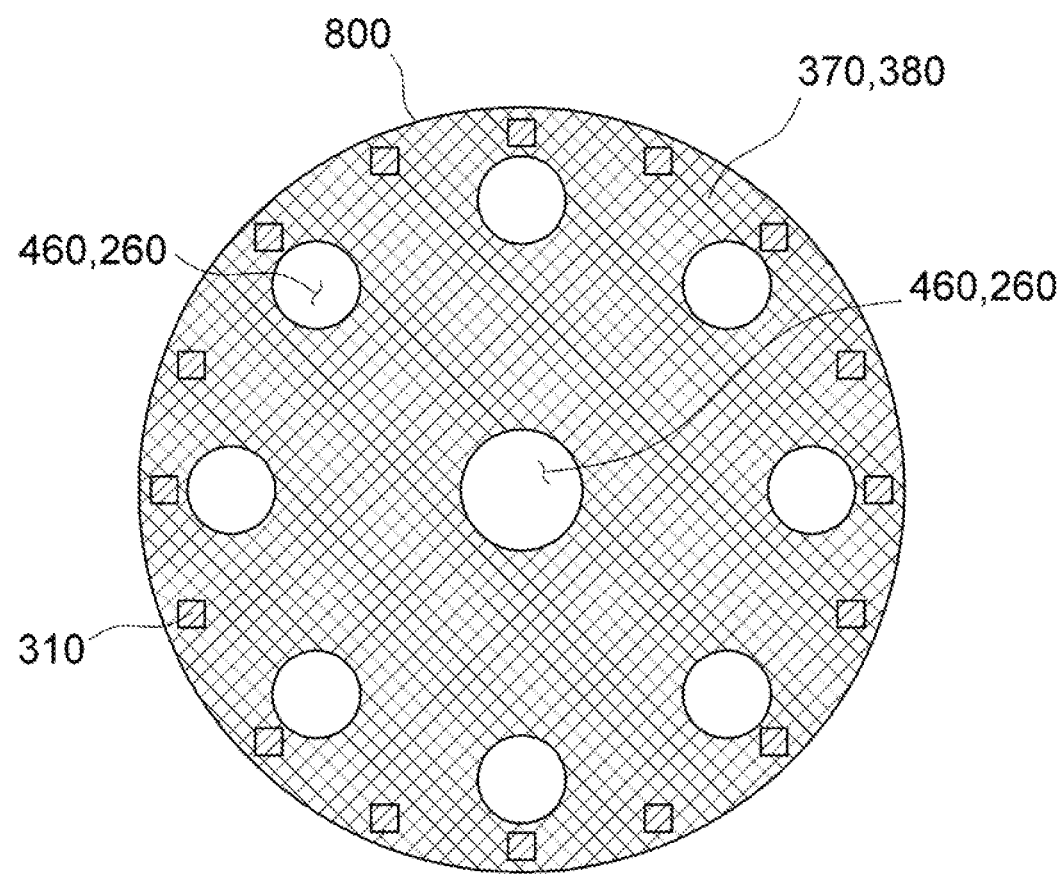
FIG. 11 is a bottom view illustrating a suction unit viewed in the direction indicated by the arrow in FIG. 8 according to an embodiment.

FIG. 11 is a view illustrating a suction unit 210 viewed in the direction indicated by the arrow AR2 in FIG. 8 according to an embodiment.

As illustrated in FIG. 8 and FIG. 11, the suction unit 210 may include a pressure measuring unit 800. The pressure measuring unit 800 may be disposed at a nozzle portion 210d of the suction unit 210. Specifically, the pressure measuring unit 800 may be disposed on a suction surface 222 of the nozzle portion 210d. In an embodiment, the pressure measuring unit 800 may be attached to the suction surface 222 of the nozzle portion 210d.

The pressure measuring unit 800 of FIG. 11 may have elements and/or structures substantially the same as or analogous to elements and/or structures of the pressure measuring unit 300 of FIG. 3. As illustrated in FIG. 11, the pressure measuring unit 800 further has a hole 460 corresponding to a suction hole 260. In an embodiment, pressure-sensitive elements 310 of FIG. 11 are all surface pressure-sensitive elements 310.

As illustrated in FIG. 11, the pressure-sensitive elements 310 may be disposed at an edge portion of the pressure measuring unit 800 between edge holes 460 and the perimeter of the pressure measuring unit 800.

Figure 12:
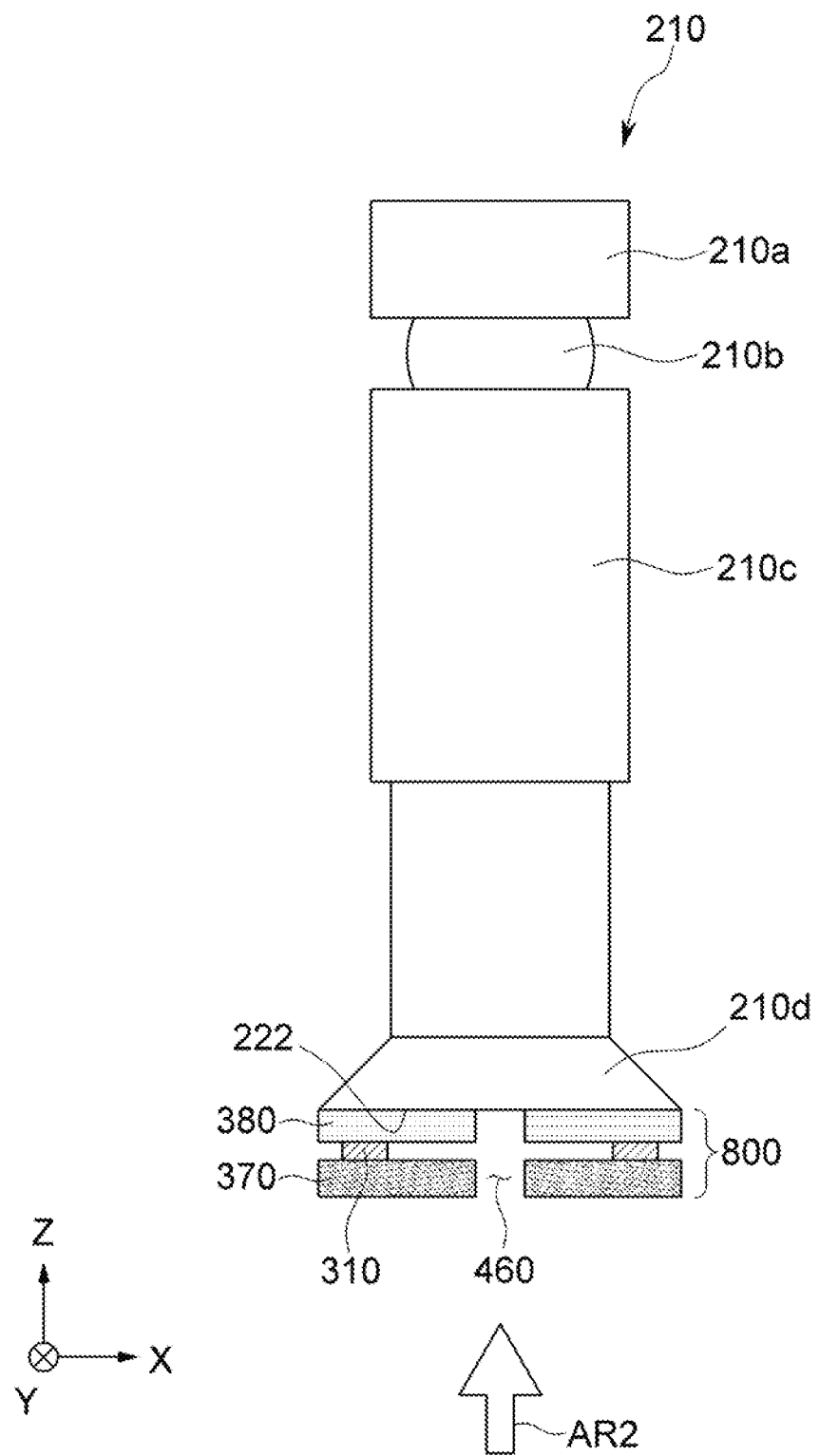
FIG. 12 is a side view illustrating a suction unit according to an embodiment.

FIG. 12 is a side view illustrating a suction unit 210 according to an embodiment.

As illustrated in FIG. 12, the suction unit 210 may include a pressure measuring unit 800. The pressure measuring unit 800 may be disposed at a nozzle portion 210d of the suction unit 210. Specifically, the pressure measuring unit 800 may be disposed on a suction surface 222 of the nozzle portion 210d. In an embodiment, the pressure measuring unit 800 may be attached to the suction surface 222.

The pressure measuring unit 800 of FIG. 12 includes a base layer 370, a plurality of pressure-sensitive elements 310, and a protective layer 380. The pressure-sensitive elements 310 may be disposed between the base layer 370 and the protective layer 380. In an embodiment, the protective layer 380 may not fill spaces between adjacent ones of the pressure-sensitive elements 310. There may be empty spaces with no solid materials between the pressure-sensitive elements 310. Advantageously, exposure of the pressure-sensitive elements 310 may be maximized for optimum measurement accuracy. In an embodiment, the pressure measuring unit 800 of FIG. 12 further has a hole 460 corresponding to a suction hole 260 of the suction unit 210. In an embodiment, none of the pressure-sensitive elements 310 of FIG. 12 overlaps or is located at the hole 460.

According to embodiments, a system for transferring substrates may adjust a suction force of a picker to a suitable level. Advantageously, the picker may secure a substrate without damaging the substrate.

While example embodiments have been illustrated and described, various changes may be made to the embodiments without departing from the scope defined by the claims.

What is claimed is:

1. A system for transferring a substrate, the system comprising:
a work table comprising a work area for supporting the substrate;
a picker comprising a suction unit; and
a pressure measuring unit adjacent to at least one of the work table and the picker, the pressure measuring unit comprising a pressure sensor,
wherein the pressure sensor is separate from the picker.

2. The system of claim 1, wherein the suction unit overlaps the pressure sensor.

3. The system of claim 1, wherein the suction unit comprises a first suction hole and a suction surface surrounding the first suction hole.

4. The system of claim 3, wherein the pressure sensor comprises:
a surface pressure sensor overlapping the suction surface; and
a first hole pressure sensor overlapping the first suction hole.

5. The system of claim 4, wherein the surface pressure sensor is positioned closer to a perimeter of the suction surface than to the first suction hole.

6. The system of claim 4, wherein the suction unit further comprises a second suction hole, and wherein the surface pressure sensor is positioned between the first suction hole and the second suction hole.

7. The system of claim 1, wherein the pressure measuring unit directly contacts the work table.

8. The system of claim 7, wherein the pressure measuring unit is disposed at the work area of the work table.

9. The system of claim 1, wherein the work table further comprises a non-work area disposed adjacent to the work area.

10. The system of claim 9, wherein the pressure measuring unit is disposed at the non-work area of the work table.

11. The system of claim 1, wherein the pressure sensor is a piezoelectric element or a load cell.

12. A system for transferring a substrate, the system comprising:
a work table comprising a work area for supporting the substrate;
a picker comprising a suction unit; and
a pressure measuring unit adjacent to at least one of the work table and the picker, wherein the pressure measuring unit comprises:
a pressure sensor;
a base layer on which the pressure sensor is disposed; and
a protective layer disposed on the base layer with the pressure sensor interposed between the protective layer and the base layer.

13. A system for transferring a substrate, the system comprising:
a work table comprising a work area for supporting the substrate; and
a picker disposed above the work table and comprising a suction unit,
wherein the suction unit comprises:
a nozzle portion disposed at an end of the suction unit; and
a pressure measuring unit disposed at the nozzle portion and comprising pressure sensor,
wherein the nozzle portion is disposed between the end of the suction unit and the pressure measuring unit.

14. The system of claim 13, wherein the nozzle portion comprises a suction surface, and wherein the pressure sensors are disposed at the suction surface.

15. The system of claim 14, wherein the nozzle portion further comprises a plurality of suction holes, wherein each of the suction holes is surrounded by the suction surface in a bottom view of the system, and wherein the pressure sensors are disposed at the suction surface and are spaced from the suction holes in the bottom view of the system.

16. The system of claim 13, wherein the pressure sensor is a piezoelectric element or a load cell.

17. A system for transferring a substrate, the system comprising:
a work table comprising a work area for supporting the substrate; and
a picker disposed above the work table and comprising a suction unit,
wherein the suction unit comprises:
a nozzle portion disposed at an end of the suction unit; and
a pressure measuring unit disposed at the nozzle portion, wherein the pressure measuring unit comprises:
a pressure sensor;
a base layer on which the pressure sensors is disposed; and
a protective layer disposed on the base layer with the pressure sensor interposed between the protective layer and the base layer.

18. The system of claim 17, wherein the pressure sensor and the protective layer are disposed between the base layer and the nozzle portion.

19. The system of claim 17, wherein at least one of the protective layer and the pressure sensor comprises amorphous silicon.

20. The system of claim 17, wherein the pressure measuring unit comprises a plurality of pressure sensors, and the protective layer does not fill a space between adjacent ones of the pressure sensors, and wherein no solid material is filled between the adjacent ones of the pressure sensors.

* * * * *